United States Patent
Lee et al.

(10) Patent No.: US 7,084,070 B1
(45) Date of Patent: **\*Aug. 1, 2006**

(54) TREATMENT FOR CORROSION IN SUBSTRATE PROCESSING

(75) Inventors: Sangheon Lee, San Jose, CA (US); Sean S. Kang, Fremont, CA (US); S M Reza Sadjadi, Saratoga, CA (US); Subhash Deshmukh, Vancouver, WA (US); Ji Soo Kim, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 250 days.

This patent is subject to a terminal disclaimer.

(21) Appl. No.: 10/623,016

(22) Filed: Jul. 17, 2003

Related U.S. Application Data (63) Continuation-in-part of application No. 10/199,190, filed on Jul. 19, 2002, now Pat. No. 6,919,278, which is a continuation-in-part of application No. 09/820,696, filed on Mar. 30, 2001, now abandoned.

(51) Int. Cl.
*H01L 21/461* (2006.01)
*H01L 21/302* (2006.01)

(52) U.S. Cl. ............... 438/714; 738/723; 738/724; 738/725; 134/1.1; 134/1.2; 134/1.3

(58) Field of Classification Search ......... 134/1.1–1.3; 438/714, 723–725

See application file for complete search history.

(56) References Cited

U.S. PATENT DOCUMENTS

| | | | |
|---|---|---|---|
| 3,398,033 A | 8/1968 | Haga et al. | |
| 4,351,894 A | 9/1982 | Yonezawa et al. | |
| 4,595,453 A | 6/1986 | Yamazaki et al. | |
| 4,735,920 A | 4/1988 | Stephanie et al. | |
| 4,865,685 A | 9/1989 | Palmour et al. | |
| 4,981,551 A | 1/1991 | Palmour et al. | |
| 5,254,215 A | 10/1993 | Terakado et al. | |

(Continued)

FOREIGN PATENT DOCUMENTS

DE  4310345 A1  10/1994

(Continued)

OTHER PUBLICATIONS

Lo, T.C. et al., "Reactive ion etching of a-SiC :H films using CC14 and 02 gas mixture", Journal of Vacuum Science and Technology: Part A, American Institute of Physics., New York, US, vol. 11, No. 2, Mar. 1, 1993.

(Continued)

*Primary Examiner*—Duy-Vu N. Deo
(74) *Attorney, Agent, or Firm*—IP Strategy Group, P.C.

(57) ABSTRACT

A method for processing substrate to form a semiconductor device is disclosed. The substrate includes an etch stop layer disposed above a metal layer. The method includes etching through the etch stop layer down to the copper metal layer, using a plasma etch process that utilizes a chlorine-containing etchant source gas, thereby forming etch stop layer openings in the etch stop layer. The etch stop layer includes at least one of a SiN and SiC material. Thereafter, the method includes performing a wet treatment on the substrate using a solution that contains acetic acid ($CH_3COOH$) or acetic acid/ammonium hydroxide ($NH_4OH$) to remove at least some of the copper oxides. Alternatively, the copper oxides may be removed using a $H_2$ plasma. BTA passivation may be optionally performed on the substrate.

50 Claims, 7 Drawing Sheets

U.S. PATENT DOCUMENTS

| | | | |
|---|---|---|---|
| 5,356,478 A | 10/1994 | Chen et al. | |
| 5,527,968 A | 6/1996 | Nakano et al. | |
| 5,527,986 A * | 6/1996 | Weber | 800/274 |
| 5,626,775 A * | 5/1997 | Roberts et al. | 216/27 |
| 5,647,953 A | 7/1997 | Williams et al. | |
| 5,681,424 A | 10/1997 | Saito et al. | |
| 5,756,400 A | 5/1998 | Ye et al. | |
| 5,770,523 A | 6/1998 | Hung et al. | |
| 5,817,578 A | 10/1998 | Ogawa | |
| 5,820,723 A | 10/1998 | Benjamin et al. | |
| 5,843,843 A | 12/1998 | Lee et al. | |
| 5,928,967 A | 7/1999 | Radens et al. | |
| 5,981,551 A | 11/1999 | Luengo et al. | |
| 6,040,248 A | 3/2000 | Chen et al. | |
| 6,074,514 A | 6/2000 | Bjorkman et al. | |
| 6,090,304 A | 7/2000 | Zhu et al. | |
| 6,103,590 A | 8/2000 | Swanson et al. | |
| 6,136,211 A | 10/2000 | Qian et al. | |
| 6,153,935 A | 11/2000 | Edelstein et al. | |
| 6,211,032 B1 | 4/2001 | Redford et al. | |
| 6,261,892 B1 | 7/2001 | Swanson | |
| 6,284,149 B1 | 9/2001 | Li et al. | |
| 6,284,657 B1 | 9/2001 | Chooi et al. | |
| 6,297,147 B1 | 10/2001 | Yang et al. | |
| 6,303,505 B1 | 10/2001 | Ngo et al. | |
| 6,323,121 B1 | 11/2001 | Liu et al. | |
| 6,355,571 B1 | 3/2002 | Huang et al. | |
| 6,387,819 B1 | 5/2002 | Yu | |
| 6,399,424 B1 | 6/2002 | Matsuura et al. | |
| 6,448,185 B1 | 9/2002 | Andideh et al. | |
| 6,527,968 B1 | 3/2003 | Wang et al. | |
| 6,528,426 B1 * | 3/2003 | Olsen et al. | 438/689 |
| 6,583,046 B1 | 6/2003 | Okada et al. | |
| 6,617,244 B1 | 9/2003 | Nishizawa | |
| 6,713,402 B1 | 3/2004 | Smith et al. | |
| 6,743,725 B1 | 6/2004 | Hu et al. | |
| 6,777,323 B1 | 8/2004 | Kakamu | |
| 6,797,627 B1 * | 9/2004 | Shih et al. | 438/694 |
| 6,861,348 B1 * | 3/2005 | Kirkpatrick et al. | 438/626 |
| 2002/0005392 A1 * | 1/2002 | Luo et al. | 216/67 |
| 2003/0235996 A1 * | 12/2003 | Leon et al. | 438/710 |
| 2004/0005787 A1 | 1/2004 | Day et al. | |
| 2004/0043598 A1 | 3/2004 | Park et al. | |
| 2005/0014667 A1 * | 1/2005 | Aoyama et al. | 510/175 |

FOREIGN PATENT DOCUMENTS

| | | |
|---|---|---|
| EP | 0600664 A2 | 6/1994 |
| EP | 0926715 A2 | 6/1999 |
| JP | 63-152125 | 6/1998 |
| JP | 2001102447 A | 4/2001 |
| WO | WO 9952135 A | 10/1999 |

OTHER PUBLICATIONS

PCT International Search Report, PCT/US02/21863 dated Jan. 29, 2003.

Moalem et al., "Low-temperature vapor-phase etching of silicon carbide by dioxygen difluoride", Applied Phys. Lett., 1995, pp. 3480-3482, vol. 66(25), American Institute of Physics, New York, USA.

U.S. Appl. No. 10/430,013; filed: May 6, 2003; Inventors: Si Yi Li.

U.S. Appl. No. 10/623,018; filed: Jul. 17, 2003; Inventors: Kang.

U.S. Appl. No. 10/623,017; filed: Jul. 17, 2003; Inventors: Lee et al.

PCT International Search Report, PCT/US02/21863 dated Jan. 29, 2003.

Office Action mailed Jun. 2, 2005 for U.S. Appl. No. 10/623,018.

Office Action mailed Jun. 7, 2005 for U.S. Appl. No. 10/623,017.

* cited by examiner

Pre-etch Condition

FIG. 3A

Post-etch Condition

TREATMENT FOR CORROSION IN SUBSTRATE PROCESSING

CROSS REFERENCE

This patent application is a continuation in part of patent application Ser. No. 10/199,190, entitled "A method for Etching Silicon Carbide", which was filed on Jul. 19, 2002, now U.S. Pat. No. 6,919,278, which is a continuation in part of application Ser. No. 09/820,696 entitled "plasma Etching of Silicon Carbide" which was filed on Mar. 30, 2001, now abandoned, all of which are incorporated by reference herein.

BACKGROUND OF THE INVENTION

The present invention relates to the etching of dielectric materials. More particularly, the present invention is related to the selective etching of silicon carbide using a chlorine containing gas.

The manufacture of multilayer structures typically involves patterned etching of areas of the semiconductor surface that are covered by a photoresist protective material. One etching technique is reactive ion etching (RIE). This process involves positioning a semiconductor wafer in a reaction chamber and feeding etchant gases into the chamber. The etchant gases are dissociated in a radio frequency (RF) field so that ions within the etchant gases are accelerated to the wafer surface.

The accelerated ions combine chemically with unmasked material on the wafer surface and a volatile etch product is produced that is incorporated into the plasma. The concentration of the volatile etch product can be tracked in order to determine the end-point of the RIE process, i.e., when the chemical reaction has removed the desired level of material from the wafer surface. During the RIE process, a single layer or multiple layers of material or film may be removed. The materials may include, for example, silicon carbide (SiC), silicon nitride (Si3N4), PSG, silicon dioxide ($SiO_2$), poly-silicon (PSi), or a low-k dielectric material.

A variety of patents teach the etching of SiC. U.S. Pat. No. 3,398,033 issued to Haga teaches wet etching of silicon carbide by the use of a mixture using oxygen ($O_2$) and chlorine ($Cl_2$) heated to between 1200° C. and 1300° C. U.S. Pat. No. 4,351,894 issued to Yonezawa teaches a plasma etch process for removing SiC using carbon tetrafluoride and optionally oxygen ($O_2$). U.S. Pat. No. 4,595,453 issued to Yamazaki teaches using hydrogen fluoride gas (HF) in a dry etch plasma process. U.S. Pat. Nos. 4,865,685 and 4,981,551, both issued to Palmour, teach reactive ion etching of SiC using NF3 and, alternatively NF3 mixed with $O_2$ and argon (Ar).

However, each of these patents fail to teach a method for selectively etching silicon carbide (SiC) at an etch rate that is higher than the etch rate for a low-k dielectric. Generally, SiC has been used as an etch stop layer or as a hardmask layer in dual damascene applications that employ low-k dielectric materials. As a result of having a SiC layer near a low-k dielectric materials, there has been a need for selectively etching the SiC at a faster rate than the low-k dielectric material.

SUMMARY OF INVENTION

The invention relates, in one embodiment, to a method for processing substrate to form a semiconductor device, the substrate including an etch stop layer disposed above a metal layer. The method includes etching through the etch stop layer, using a plasma etch process that utilizes a chlorine-containing etchant source gas, thereby forming etch stop layer openings in the etch stop layer. Thereafter, the method includes performing a wet treatment on the substrate, the wet treatment including a rinse using a solution that contains acetic acid ($CH_3COOH$).

In one embodiment, the copper metal surface is passivated using a passivating solution that includes benzotriazole(BTA) after the etch stop layer is etched through.

In another embodiment, the invention includes a method for performing a dual damascene process on a substrate. The substrate includes a dielectric layer disposed above an etch stop layer, the etch stop layer being disposed above a metal layer. The method includes performing plasma etching through the dielectric layer using a first etchant source gas to form a plurality of dielectric-layer openings. There is included performing plasma etching through the etch stop layer, using a second etchant source gas different from the first etchant source gas, the second etchant source gas including chlorine, thereby forming etch stop layer openings in the etch stop layer. The method further includes performing thereafter a wet treatment on the substrate. The wet treatment includes a rinse using a solution that contains acetic acid ($CH_3COOH$).

In yet another embodiment, the invention includes a method for processing substrate to form a semiconductor device. The substrate includes an etch stop layer disposed above a metal layer. The method includes etching through the etch stop layer, using a plasma etch process that utilizes a chlorine-containing etchant source gas, thereby forming etch stop layer openings in the etch stop layer. There is further included performing, thereafter, a rinse on the substrate, the rinse using a rinsing solution that includes de-ionized water. Additionally, there is included performing, thereafter, a $H_2$ plasma treatment on the substrate.

The invention relates, in one embodiment, to a method for processing substrate to form a semiconductor device. The substrate includes an etch stop layer disposed above a copper metal layer. The method includes etching through the etch stop layer, using a plasma etch process that utilizes a chlorine-containing etchant source gas, thereby forming etch stop layer openings in the etch stop layer. The method further includes passivating the copper metal layer through the etch stop layer openings with a passivating solution that includes an benzotriazole.

BRIEF DESCRIPTION OF THE DRAWINGS

Preferred embodiments of the present invention are shown in the accompanying drawings wherein:

FIG. 1A–D shows schematic representations of a via-first dual-damascene structure which can be etched according to the process of the invention.

FIGS. 2A–D show schematic representations of a trench-first dual-damascene structure which can be etched according to the process of the invention.

FIGS. 3A–B shows schematic representations of a self-aligned dual-damascene structure which can be etched according to the process of the invention.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

The invention provides a process for plasma etching silicon carbide (SiC) with selectivity to an overlapping an/or underlying dielectric layer of material. The dielectric material can comprise various low-k dielectric materials, including organic low-k materials, inorganic dielectric materials, silicon dioxide, silicon oxynitride, or the like. In order to achieve a desired selectivity to such dielectric materials, the plasma etch gas chemistry is selected to achieve a desired etch rate of the silicon carbide while etching the dielectric material at a slower rate.

Silicon carbide has favorable characteristics as a semiconductor material, including its wide bandgap, high thermal conductivity, high saturated electron drift velocity and high electron mobility. These characteristics make SiC an attractive dielectric material for integrated circuits. Additionally, SiC has found application as etch stops, protective coatings, masks, diffusion barriers, and the like due to its relative resistance to certain types of etchants utilized in multilayer integrated circuit manufacturing. However, there are certain difficulties working with silicon carbide, including high process temperatures, impurity of starting materials, difficulty with certain doping techniques, and limited development of suitable etching techniques with high selectivity ratios.

The invention provides a semiconductor manufacturing process wherein openings can be plasma etched in silicon carbide layers while providing desired selectivity to underlying and/or overlying low-k dielectric layers. Low-k dielectrics can be categorized as follows: doped oxide, organic, highly fluorinated, and porous materials. Low-k materials can be deposited either by spin-on or CVD methods. Porous materials typically use spin-on methods, with controlled evaporation of the solvent providing the desired pore structure. A Table of typical low-k dielectrics is provided below.

TABLE 1

Illustrative Low-k Dielectric Materials

| Film Types | Sub-Type | Examples | k range |
|---|---|---|---|
| Doped Oxide | F-doped | FSG | 3.5 |
|  | H-doped | HSQ | 2.7–3.5 |
|  | C (and H) doped | OSG, MSQ, CVD low-k | 2.6–2.8 |
| Organic |  | BCB, SiLK, FLARE, PAE-2 | 2.6–2.8 |
| Highly Fluorinated |  | Parylene AF4, a-CF, PTFE | 2.0–2.5 |
| Porous |  | Aerogels, Xerogels, Nanogels | <2.2 |

Low-k dielectric materials have dielectric constants of less than 4.0, and generally the dielectric constants are less than 3.0.

According to the invention, in the manufacture of a single or dual-damascene structure wherein a low-k dielectric layer is etched with 0.25 μm or smaller geometry to an etch depth of at least 1.8 μm, (e.g., High Aspect Ratio Contact, or HARC, etching), a silicon carbide layer is etched with a silicon carbide to low-k dielectric etch rate selectivity of greater than 1:1. Thus, the SiC etch rate is greater than the low-k dielectric etch rate. This is also the case for typical dual damascene structures wherein via depth is about 0.5~1.0 μm and trench is about 0.5 μm. However, the absolute geometry dimension and etch depth is not limiting in the present invention.

By way of example and not of limitation, the structures can include a hard mask having a thickness of approximately 40 to 60 nm; low-k dielectric layers having a thickness of approximately 200 to 400 nm; etch stop layers having a thickness of approximately 40 to 60 nm; barrier layers having a thickness of around 40 to 60 nm, metallization layers, metallization filled vias and trenches and the like. In the following description, silicon carbide may be used for one or more layers of various damascene structures. However, the process of the invention is applicable to any integrated circuit structure wherein silicon carbide is used an etched component of the structure.

Figure 1A:
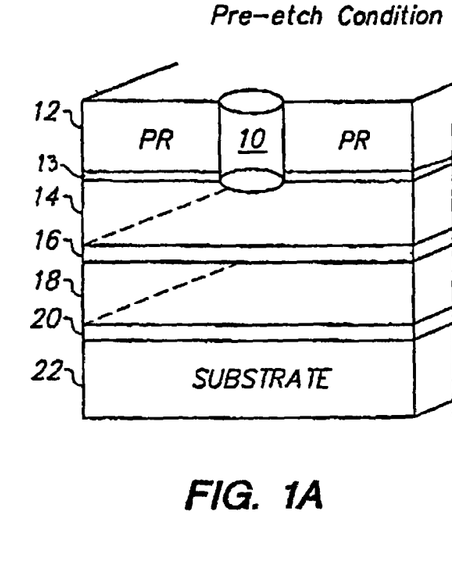
FIG. 1A shows a pre-etch condition.
Figure 1B:
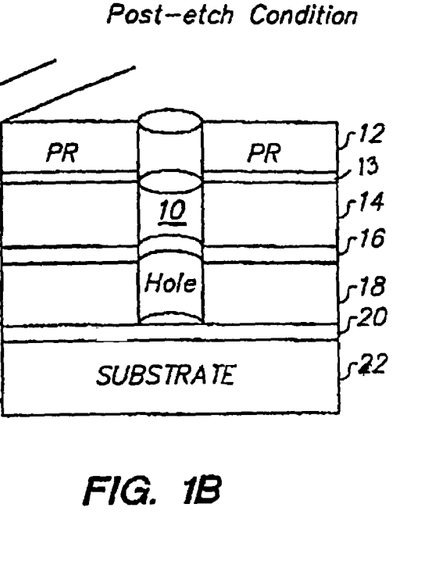
FIG. 1B shows a post-etch condition in which a via has been etched.
Figure 1C:
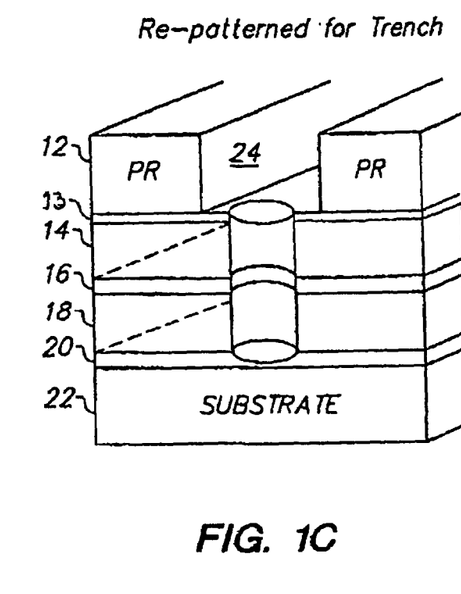
FIG. 1C shows the structure re-patterned for a trench etch.
Figure 1D:
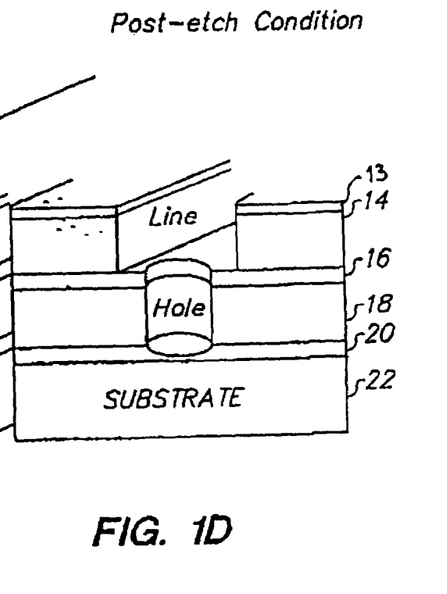
FIG. 1D shows a post-etch condition in which the trench has been etched and the PR has been stripped.

FIGS. 1A–D show schematics of how a silicon carbide layer can be etched during a via first dual damascene etch process. FIG. 1A shows a pre-etch condition wherein an opening 10 corresponding to a via is provided in a photoresist 12 which overlies a stack of layers including a mask 13 of silicon carbide, a first low-k dielectric 14, a first stop layer 16 of silicon carbide, a second low-k dielectric layer 18, a second stop layer 20 of silicon carbide and a substrate 22 such as a silicon wafer which may include an electrically conductive layer (not shown) and other layers such as barrier layers (not shown) beneath the etch stop layer 20. FIG. 1B shows the structure after etching wherein the opening 10 extends through the mask 13, the low-k dielectric layers 14, 18 and the first stop layer 16 to the second stop layer 20. FIG. 1C shows the structure after re-patterning the masking layer for a trench 24. FIG. 1D shows the structure after stripping of the photoresist and etching wherein the first low-k dielectric layer 14 is etched down to the first stop layer 16. The opening 10, also referred to as a "hole", in FIG. 1D is shown to extend to the second etch stop layer 20. It shall be appreciate by those skilled in the art having the benefit of this disclosure, that the post etch condition displayed in FIG. 1D may include extending the opening 10 through the second etch stop layer 20 to the substrate 22.

Figures 2A, 2B:
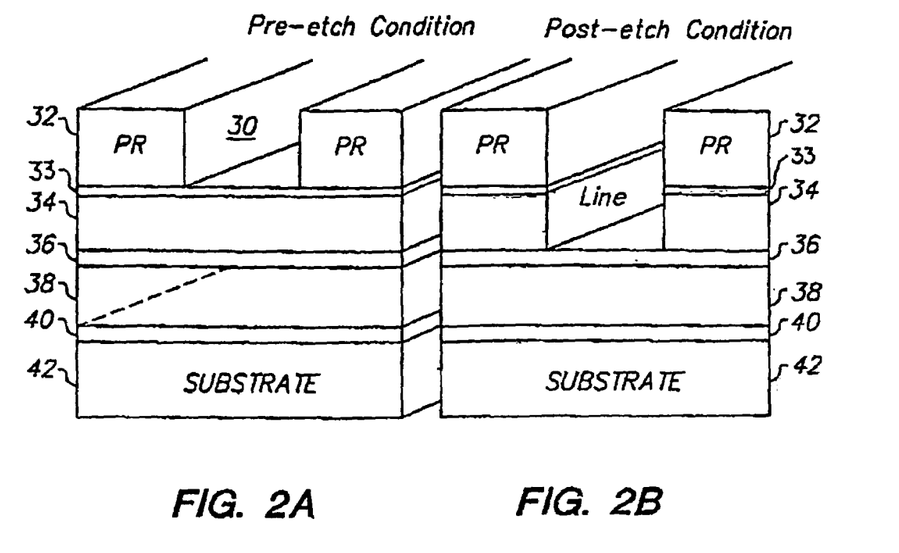
FIG. 2A shows a pre-etch condition.
FIG. 2B shows a post-etch condition in which a trench has been etched.
Figures 2C, 2D:
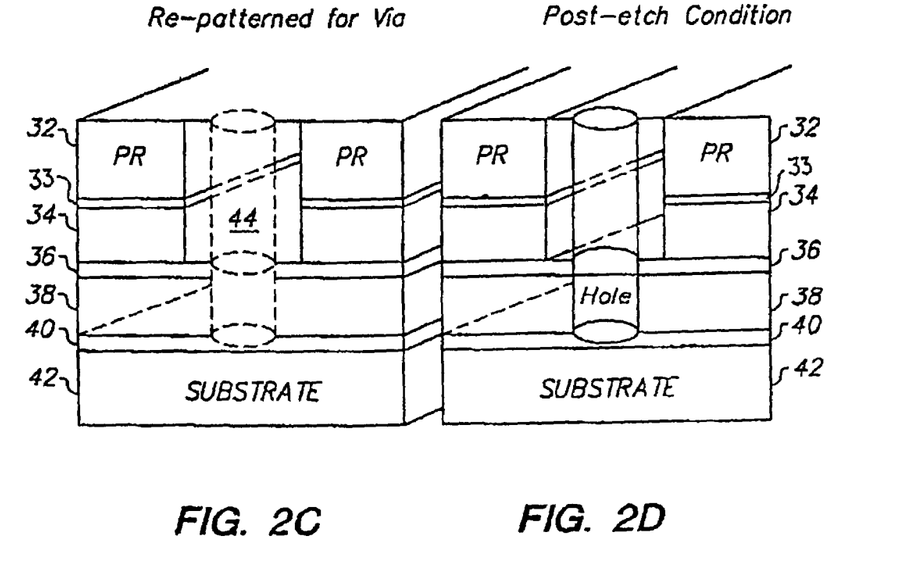
FIG. 2C shows the structure re-patterned for a via etch.
FIG. 2D shows a post-etch condition in which the via has been etched prior to PR strip.

FIG. 2A–D shows schematics of how a silicon carbide layer can be etched during a trench-first dual-damascene etch process. FIG. 2A shows a pre-etch condition wherein an opening 30 corresponding to a trench is provided in photoresist masking layer 32 which overlies a stack of layers including a mask layer 33, a first low-k dielectric layer 34, a first stop layer 36 of silicon carbide, a second low-k dielectric layer 38, a second stop layer 40 of silicon carbide, and a substrate 42 such as silicon wafer which may further include metallization and barrier layers (not shown) beneath the stop layer 40. FIG. 2B shows the structure after etching wherein the opening 30 extends through the low-k dielectric layer 34 to the first stop layer 36. FIG. 2C shows the structure after repatterning for a via 44. FIG. 2D shows the structure after etching wherein the second low-k dielectric layer 38 is etched down to the second stop layer 40. The opening 30 in FIG. 2D is shown to extend to the second etch stop layer 40. It shall be appreciated by those skilled in the art having the benefit of this disclosure, that the post etch conditon displayed in FIG. 2D may include extending the opening 30 through the second etch stop layer 40 to the substrate 42.

Figure 3A:
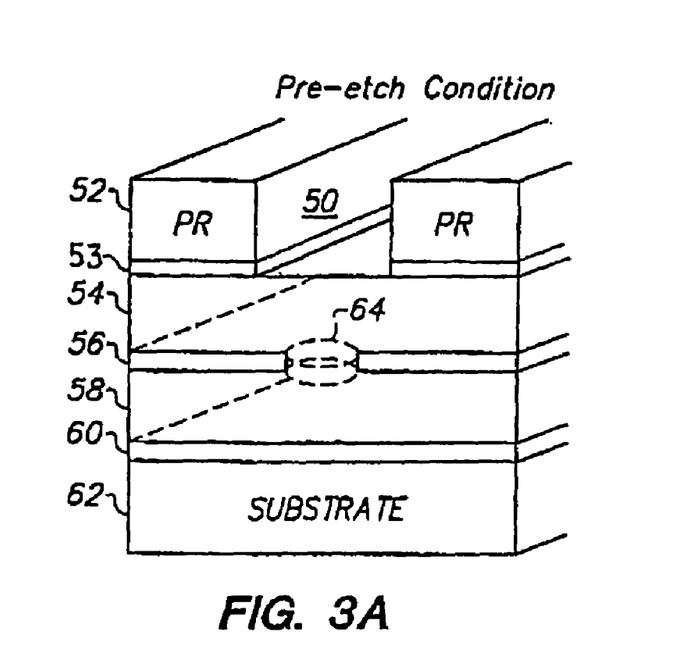
FIG. 3a shows a pre-etch condition.
Figure 3B:
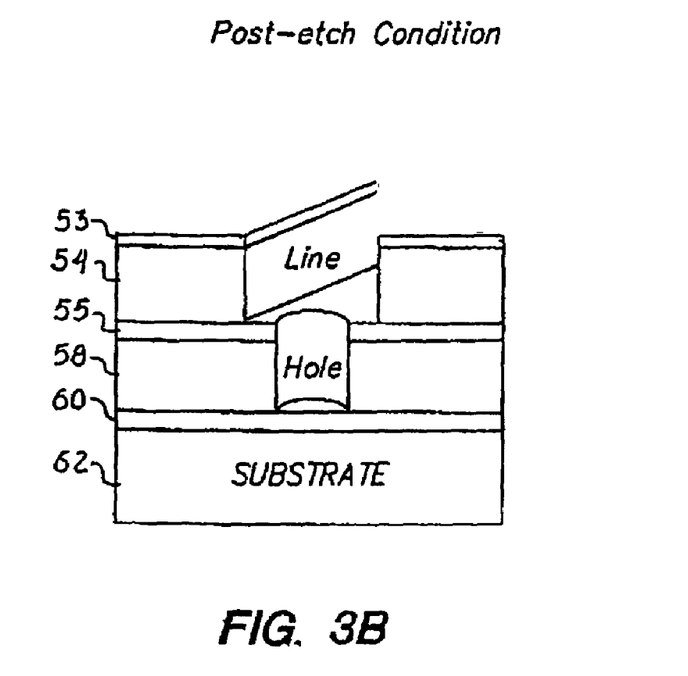
FIG. 3B shows a post-etch condition in which and a via have been etched.

FIGS. 3A–B shows schematics of how a silicon carbide layer can be etched during a single step dual-damascene etch process. FIG. 3A shows a pre-etch condition wherein an opening 50 corresponding to a trench is provided in a photoresist 52 and a masking layer 53 which overlies a stack of layers including a first low-k dielectric layer 54, a first stop layer 56 of silicon carbide, a second low-k dielectric layer 58, a second stop layer 60 of silicon carbide, and a substrate 62 such as a silicon wafer which can include metallization and barrier layers (not shown) beneath the stop layer 60. In order to obtain etching of vias through the first stop layer 56 in a single etching step, first stop layer 56 includes an opening 64. FIG. 3B shows the structure after etching wherein the opening 50 extends through the low-k dielectric layer 54 to the first stop layer 56 and the opening 64 extends through the second low-k dielectric 58 to the second stop layer 60. The hole in FIG. 3B is shown to extend to the second etch stop layer 60. It shall be appreciated by those skilled in the art having the benefit of this disclosure that the post etch condition displayed in FIG. 3B may include extending the opening 60 through the second etch stop layer 60 to the substrate 62. Such an arrangement can be referred to as a "self-aligned dual-damascene" structure.

The process of the invention is applicable to etching of silicon carbide layers in damascene or other integrated circuit structures including etching of silicon carbide layers in the form of substrates. The process of the invention is applied in manufacturing multilayer structures which includes various low-k dielectric materials. The low-k dielectrics include but are not limited to doped silicon oxide such as fluorinated silicon oxide (FSG), silicate glasses such as boron phosphate silicate glass (BPSG) and phosphate silicate glass (PSG), organic polymer materials such as polyimide, organic siloxane polymer, poly-arylene ether, carbon-doped silicate glass, silsesquioxane glass, fluorinated and non-fluorinated silicate glass, diamond-like amorphous carbon, aromatic hydrocarbon polymer such as SiLK (a product available from Dow Chemical Co.), γ-doped silica glass such CORAL (a product available from Novellus Systems, Inc.), or other suitable dielectric material having a dielectric constant below 4.0, and generally below 3.0. Such low-k dielectric layers can overlie an intermediate layer such as a barrier layer and a conductive or semiconductive layers such as polycrystalline silicon, metals such as aluminum, copper, titanium, tungsten, molybdenum or alloys thereof, nitrides such as titanium nitride, metal suicides such as titanium silicide, cobalt silicide, tungsten silicide, molybdenum silicide, etc.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) etch reactor available from Lam Research Corporation which is also called inductively coupled plasma reactor, an electron-cyclotron resonance (ECR) plasma reactor, a helicon plasma reactor, or the like. An illustrative plasma may be produced in a parallel plate etch reactor such as the dual frequency plasma etch reactor described in commonly owned U.S. Pat. No. 6,090,304, the disclosure of which is hereby incorporated by reference.

Figure 4:
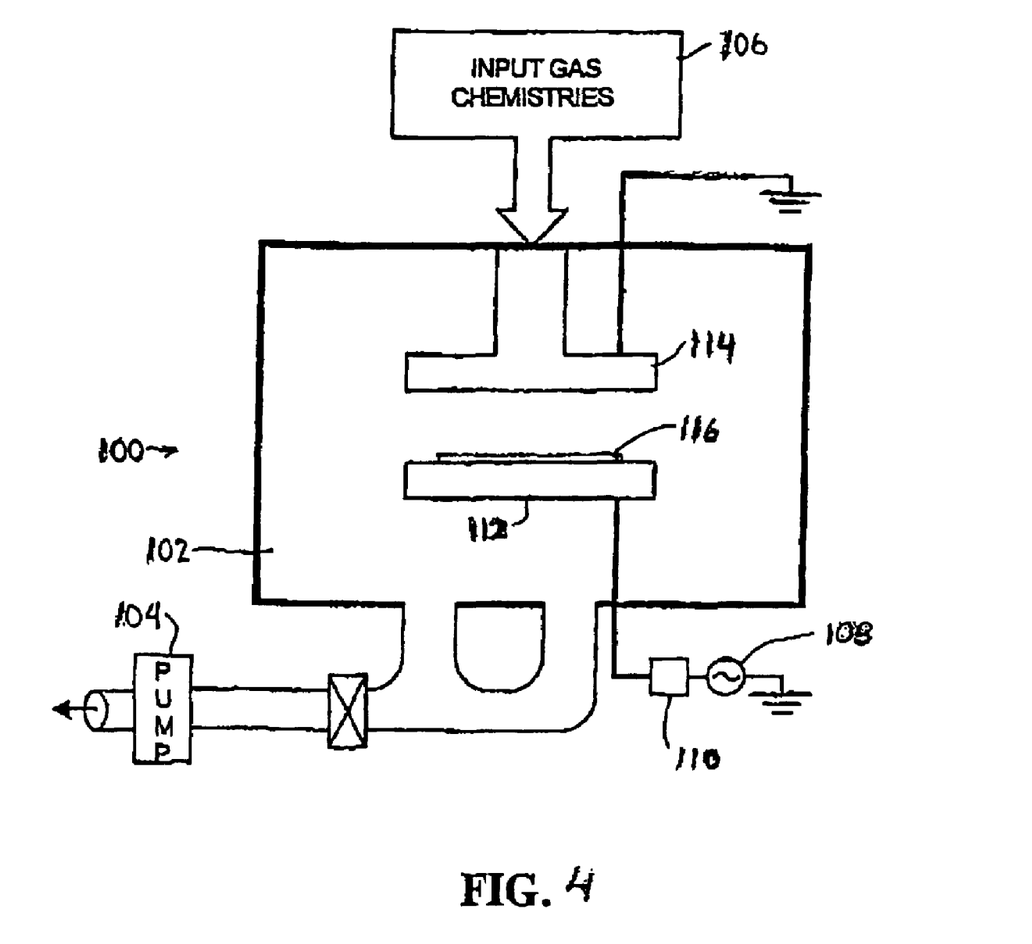
FIG. 4 shows a schematic representation of a medium density parallel plate plasma reactor which can be used to carry out the process of the invention.

The process of the invention may be carried out in a parallel plate plasma reactor such as reactor 100 shown in FIG. 4. The reactor 100 includes a chamber having an interior 102 maintained at a desired vacuum pressure by a vacuum pump 104 connected to an outlet in a wall of the reactor. Etching gas can be supplied to the plasma reactor supplying gas from gas supply 106. A medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A substrate 116 is supported by the powered electrode 112 and is etched with plasma generated by energizing the etch gasses into a plasma state. Other capacitively coupled reactors can also be used such as reactors wherein RF power is supplied to both electrodes.

Each of the etching gas mixtures described below provide for the selective etching of a silicon carbide (SiC) layer at a faster rate than the etching of a low-k dielectric layer, thereby providing improved SiC to low-k dielectric etch selectivity. The illustrative low-k dielectric is referred to as CORAL which is a trademarked product of Novellus Systems, Inc. of San Jose, Calif. CORAL is an organo-silicate glass (OSG) film having the chemical formula SiOCH. For purposes of this patent application the terms CORAL and organo-silicate glass will be used interchangeably. Typically, CORAL has a dielectric constant of 2.85 and a refractive index of 1.39. Additionally, the density of CORAL is low, i.e. 1.34 g/cm3, compared to $SiO_2$, i.e. 1.72 g/cm3, due to the —CH3 (methyl) substitution for oxygen in the Si—O—Si linkages.

A first etching gas mixture embodiment having a high silicon carbide (SiC) to low-k dielectric selectivity comprises hydrogen and a chlorine containing gas mixture. The chlorine containing gas mixture includes either HCl, $BCl_3$, $Cl_2$ or any combination thereof. Typically, the hydrogen is gaseous $H_2$ and the chlorine containing gas mixture is $Cl_2$. For 200 mm applications, the chemical constituents are supplied to the chamber at flow rates of 10 to 100 sccm for the chlorine ($Cl_2$) containing gas, flow rates of 50 to 550 sccm for the hydrogen ($H_2$) gas, and flow rates of 0 to 100 sccm for an inert carrier gas such as Argon. Alternatively, other inert gases that may be used which include noble gases such as He, Ne, Kr, and Xe.

Table 2 provides an even more detailed illustrative example of the operating parameters for an illustrative etch process using hydrogen and chlorine. In each of the illustrative examples provided below the SiC layer is below the illustrative low-k dielectric, i.e. CORAL, layer. The etchant gas chemistry for Table 2 includes a chlorine containing gas, $Cl_2$, having a flow rate of 100 sccm and a hydrogen, $H_2$, gas flow rate of 100 sccm. Additionally, in the illustrative example in Table 2 there is no Argon being fed to the chamber. Other operating parameter in Table 2 include a chamber pressure of 70 mTorr, and an RF power of 300 watts at 27 MHz applied to the powered electrode 112.

TABLE 2

Exemplary Gas Mixture: $H_2$ and $Cl_2$

| Etchant Gas Component | Supply Rate (sccm) | Chamber Pressure (mTorr) | RF Power (W) | SiC Etch Rate (Å/min) | CORAL Etch Rate (Å/min) |
|---|---|---|---|---|---|
| $Cl_2$ | 100 | 70 | 300 | 2413 | 780 |
| $H_2$ | 100 | | | | |
| Ar | 0 | | | | |

Using RF power of 300 watts at 27 MHz for the powered electrode the etch rate for the silicon carbide was 2413 Å/min and the etch rate for the CORAL dielectric was 780 Å/min. The selectivity ratio for silicon carbide to CORAL in the illustrative example of Table 2 is 3.1:1.

In Table 3 an alternative embodiment is shown in which the hydrogen gas is applied at a flow rate of 50 sccm. Additionally, Argon gas is applied at 50 sccm. The chlorine is supplied at the same flow rate as in Table 2, namely, 100 sccm. The chamber pressure and the applied RF power also remains the same.

TABLE 3

Exemplary Gas Mixture: $H_2$, $Cl_2$ and Ar

| Etchant Gas Component | Supply Rate (sccm) | Chamber Pressure (mTorr) | RF Power (W) | SiC Etch Rate (Å/min) | CORAL Etch Rate (Å/min) |
|---|---|---|---|---|---|
| $Cl_2$ | 100 | 70 | 300 | 2316 | 1045 |
| $H_2$ | 50 | | | | |
| Ar | 50 | | | | |

The resulting etch rate for the silicon carbide is 2316 Å/min and the etch rate for the CORAL low-k dielectric is 1045 Å/min. The resulting silicon carbide to CORAL selectivity is 2.2:1.

In Table 4 yet another embodiment is shown in which the hydrogen gas is applied at a flow rate of 250 sccm. Argon gas is not applied. The chlorine is supplied at the same flow rate as in Table 2 and Table 3. The chamber pressure remains and the applied RF power also remains the same as in Table 2 and Table 3.

TABLE 4

Exemplary Gas Mixture: $H_2$ and $Cl_2$

| Etchant Gas Component | Supply Rate (sccm) | Chamber Pressure (mTorr) | RF Power (W) | SiC Etch Rate (Å/min) | CORAL Etch Rate (Å/min) |
|---|---|---|---|---|---|
| $Cl_2$ | 100 | 70 | 300 | 2248 | 1062 |
| $H_2$ | 250 | | | | |
| Ar | 0 | | | | |

The resulting silicon carbide etch rate is 2248 Å/min and the CORAL etch rate is 1062 Å/min. The resulting silicon carbide to CORAL selectivity ratio is 2.1:1.

Table 5 reflects another embodiment in which the RF power is increased to 400 watts. The other operating parameters include a chlorine flow rate of 100 sccm, a hydrogen flow rate of 100 sccm, and a chamber pressure of 70 mTorr.

TABLE 5

Exemplary Gas Mixture: $H_2$ and $Cl_2$

| Etchant Gas Component | Supply Rate (sccm) | Chamber Pressure (mTorr) | RF Power (W) | SiC Etch Rate (Å/min) | CORAL Etch Rate (Å/min) |
|---|---|---|---|---|---|
| $Cl_2$ | 100 | 70 | 400 | 3265 | 1325 |
| $H_2$ | 100 | | | | |
| Ar | 0 | | | | |

The resulting etch rate for the silicon carbide and CORAL is 3265 Å/min and 1325 Å/min, respectively. The selectivity ratio of silicon carbide to CORAL is 2.5:1.

Referring to Table 6 there is shown still another alternative embodiment in which the chamber pressure is increased to 200 mTorr. The flow rate for the chlorine and hydrogen gas are both 100 sccm. The applied RF power is 300 Watts at 27 MHz.

TABLE 6

Exemplary Gas Mixture: $H_2$ and $Cl_2$

| Etchant Gas Component | Supply Rate (sccm) | Chamber Pressure (mTorr) | RF Power (W) | SiC Etch Rate (Å/min) | CORAL Etch Rate (Å/min) |
|---|---|---|---|---|---|
| $Cl_2$ | 100 | 200 | 300 | 2213 | 754 |
| $H_2$ | 100 | | | | |
| Ar | 0 | | | | |

The resulting silicon carbide etch rate is 2213 Å/min and CORAL etch rate is 754 Å/min. The silicon carbide to CORAL selectivity ration is 2.9.

The high silicon carbide to CORAL selectivity ratios can also be obtained for other low-k dielectrics which include polyimides, organic siloxane polymers, poly-arylene ethers, carbon-doped silicate glass or silsesquioxane glass, spin-on glass, fluorinated or non-fluorinated silicate glass, diamond-like amorphous carbon, aromatic hydrocarbon polymer such as "SILK" (a trademark of Dow Chemical Co.), or any similar low dielectric constant (low-k) material known in the art to be useful as a low-k dielectric material.

It shall be appreciated by those skilled in the art that the optimal flow rates and ratios for the illustrative gas mixture of Table 2 through Table 6 may change depending on the type of plasma etch chamber, the substrate size, and other such variables that are well known to those skilled in the art. Furthermore, it shall also be appreciated by those of ordinary skill in the art that the selection of temperatures, power level, and gas pressures used in practicing the present invention can vary widely and that those specified herein are give by way of example, and not as a limitation for the scope of the invention.

A second etchant gas mixture in which the SiC etch rate is greater than the low-k dielectric etch rate includes a nitrogen gas and a chlorine containing gas. The chlorine containing gas mixture includes either HCl, $BCl_3$, $Cl_2$ or any combination thereof. Typically, the nitrogen is gaseous $N_2$ and the chlorine containing gas mixture is $Cl_2$.

Typically, the chemical constituents are supplied to the chamber at flow rate of 10 to 100 sccm for the chlorine ($Cl_2$) containing gas, flow rates of 50 to 550 sccm for the nitrogen ($N_2$) gas, and flow rates of 0 to 100 sccm for an inert carrier gas such as Argon. As previously described, other inert carrier gases include noble gases such as He, Ne, Kr, and Xe.

A more detailed illustrative example of the operating parameters for an illustrative etch process using the second gas mixture is set forth in Table 7. The etchant gas chemistry for Table 7 includes a chlorine containing gas, $Cl_2$, having a flow rate of 100 sccm and a nitrogen, $N_2$, gas flow rate of 50 sccm. Additionally Table 3 includes an illustrative carrier gas, Argon, as part of the etchant gas chemistry being fed at a flow rate of 50 sccm. Other operating parameters described in Table 7 include a chamber pressure of 70 mTorr, and an RF power of 300 watts at 27 MHz.

TABLE 7

Exemplary Gas Mixture: $N_2$, $Cl_2$ and Ar

| Etchant Gas Component | Supply Rate (sccm) | Chamber Pressure (mTorr) | Top RF Power (W) | SiC Etch Rate (Å/min) | CORAL Etch Rate (Å/min) |
|---|---|---|---|---|---|
| $Cl_2$ | 100 | 70 | 300 | 1568 | 1000 |
| $N_2$ | 50 | | | | |
| Ar | 50 | | | | |

The resulting etch rate for the silicon carbide in Table 7 is 1568 Å/min and the CORAL etch rate is 1000 Å/min. The resulting selectivity ratio of silicon carbide to CORAL is 1.6:1.

For the nitrogen and chlorine gas mixtures the high silicon carbide to CORAL selectivity ratio can also be obtained for other low-k dielectric materials. Again the reference to CORAL is used simply as an illustrative example. Additionally, as described above the optimal flow rates and ratios for the illustrative gas mixture of Table 7 may change depending on the type of plasma etch chamber, the substrate size, temperature, power level, gas pressure and other such variables that are well known to those skilled in the art.

A third etchant gas mixture in which the SiC etch rate is greater than the low-k dielectric etch rate includes an oxygen gas and a chlorine containing gas. The chlorine containing gas mixture includes either HCl, $BCl_3$, $Cl_2$ or any combination thereof. Typically, the oxygen is gaseous $O_2$ and the chlorine containing gas mixture is $Cl_2$. In some cases, an inert gas such Ar, He, Ne, Kr, or Xe may also be added to the etchant gas mixture.

Typically, the chemical constituents are supplied to the chamber at a flow rate of 10 to 100 sccm for the chlorine ($Cl_2$) containing gas, a flow rate of about 0 to about 50 sccm for the oxygen ($O_2$) gas, and a flow rate of about 0 to about 500 sccm for an inert carrier gas such as argon.

A more detailed illustrative example of the operating parameters for an illustrative etch process using the third gas mixture is set forth in Table 7. The etchant gas chemistry for Table 7 includes a chlorine containing gas, $Cl_2$, having a flow rate of about 100 sccm and an oxygen, $O_2$, gas flow rate of about 20 sccm. Additionally Table 8 includes an illustrative carrier gas, argon, as part of the etchant gas chemistry being fed at a flow rate of about 100 sccm. Other operating parameters described in Table 8 include a chamber pressure of about 70 mTorr, and an RF power of about 300 watts at about 27 MHz.

TABLE 8

Exemplary Gas Mixture: $O_2$, $Cl_2$ and Ar

| Etchant Gas Component | Supply Rate (sccm) | Chamber Pressure (mTorr) | Top RF Power (W) | SiC Etch Rate (Å/min) | CORAL Etch Rate (Å/min) |
|---|---|---|---|---|---|
| $Cl_2$ | 100 | 70 | 300 | 1158 | 203 |
| $O_2$ | 20 | | | | |
| Ar | 100 | | | | |

The resulting etch rate for the silicon carbide in Table 8 is about 1158 Å/min and the CORAL etch rate is about 203 Å/min. The resulting selectivity ratio of silicon carbide to CORAL is about 5.7:1.

A comment about SiC films may be in order at this point. There are different SiC films, including for example, oxygen-doped SiC films, P-doped SiC films, nitrogen-doped SiC films, hydrogenated SiC films, and the like. The examples herein have been conducted with oxygen-doped SiC films. It is believed that the etch rate through other types of SiC films (i.e., other than oxygen-doped SiC films) may be substantially higher and thus, the selectivity with respect to CORAL and/or other oxide materials may be substantially higher than shown by the values herein. Thus, the particular SiC film, the etch rate and selectivity values herein should be understood to be examples only and are not limiting in any way.

For the oxygen and chlorine gas mixtures the high silicon carbide to CORAL selectivity ratio can also be obtained for other low-k dielectric materials. Again the reference to CORAL is used simply as an illustrative example. Additionally, as described above the optimal flow rates and ratios for the illustrative gas mixture of Table 8 may change depending on the type of plasma etch chamber, the substrate size, temperature, power level, gas pressure and other such variables that are well known to those skilled in the art.

The above-discussed use of a chlorine-based etchant to etch through the etch stop layer of silicon carbide or silicon nitride, while advantageous in providing excellent selectivity with respect to the low-K material and in maintaining the desired vertical profile, may give rise to corrosion issues. When the chlorine is employed to etch through the SiC/SiN etch stop layer down to, for example, the copper metal line the residual chlorine on the copper metal line surface may corrode part or all of the copper metal line over time. This corrosion would detrimentally affect the electrical characteristics of the copper metal line, and result in device failure.

In accordance with one embodiment of the present invention, the residual chlorine is removed using an in-situ hydrogen plasma post-etch treatment. The hydrogen species in the plasma reacts with the chlorine residue, forming volatile hydrogen chloride, which can then be evacuated away from the chamber.

Figure 5:
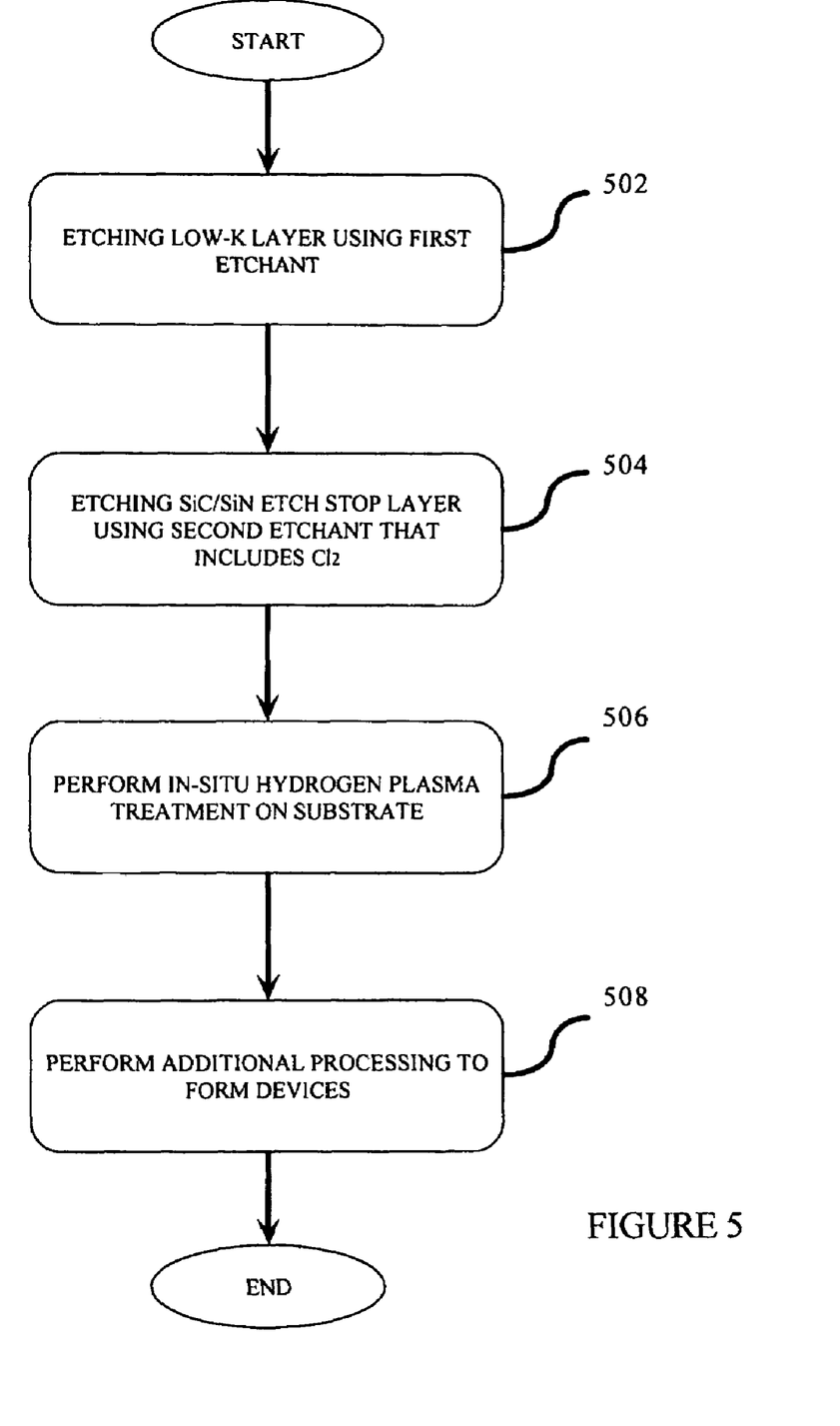
FIG. 5 shows, in accordance with one embodiment of the present invention, the steps of performing the in-situ hydrogen plasma post-etch treatment to reduce corrosion damage to the underlying metal layer.

FIG. 5 shows, in accordance with one embodiment of the present invention, the steps of performing the in-situ hydrogen plasma post-etch treatment to reduce corrosion damage to the underlying metal layer. In step 502, an overlying low-K layer is etched. This etch creates openings in the low-K layer, as described earlier. In step 504, a plasma employing an etchant that includes chlorine is employed to etch through the SiC or SiN etch stop layer, down to the metallization layer. This etch step may be performed as part of a dual damascene or single damascene process for example. The metallization layer may represent, for example, a copper metal layer. Generally speaking, the chlorine-based plasma is employed to break through the SiC or SiN layer due to the superior selectivity with respect to the low-K material of the layer stack and the ability to maintain a vertical etch profile, particularly in the low-K layer.

In step 506, a hydrogen-containing etchant is employed to generate a hydrogen-based plasma in-situ. The etchant employed during the post-etch treatment is different from that employed to etch through the SiC/SiN etch stop layer. Since the process is in-situ, the substrate is advantageously not exposed to the ambient atmosphere and ambient moisture prior to the hydrogen plasma post-etch treatment to remove the chlorine residues. Further, the in-situ process saves time, which increases substrate throughput.

In step 508, additional processing steps are performed to form the desired device. Optionally during step 508, a de-ionized water rinse may be performed in addition to the aforementioned hydrogen plasma post-etch treatment. In most cases, however, the de-ionized water rinse is not needed in addition to the hydrogen plasma post-etch treatment to satisfactorily remove the chlorine residue from the surface of the metal lines.

In one embodiment, the hydrogen plasma post-etch treatment is performed in the same Excelan HPT™ plasma processing chamber employed to etch through the SiC or SiN layer. In one embodiment, one or more inert gases, such as argon, are added to the hydrogen-containing etchant source gas in order to help strike and/or sustain the plasma. Generally speaking, the amount of inert gas(es) should be kept low in order to avoid unduly sputtering the substrate surface during the hydrogen plasma post-etch treatment process.

In one embodiment, the hydrogen plasma post-etch treatment is performed at a chamber pressure of about 90 mTorr and a substrate temperature of about 20° C., with about 200 W of power supplied by the 27 MHz power source and about 100 W of power supplied to the 2 MHz power source. The flow rates of the etchant source gases are about 150 sccm of argon and about 300 sccm of hydrogen. The hydrogen plasma post-etch treatment lasts between about 5–15 seconds, in one embodiment. The duration may be adjusted based on empirically determined corrosion remediation data. Generally speaking, a shorter duration is preferred to improve substrate throughput as long as the chlorine residue is adequately removed.

It should be pointed out that the above parameters may vary to suit the needs of a particular process and/or chamber. For example, a higher substrate temperature may increase the volatility of the hydrogen chloride, which may help remove the chlorine residue faster. As another example, if the chamber can be run at a higher pressure (e.g., about 300 mT or above) and $H_2$ flow is higher (e.g., about 600 sccm–1000 sccm or above), it may be possible to sustain the plasma without requiring the use of an inert gas, such as argon. In one embodiment, elemental analysis is employed to test the substrate for the presence and/or amount of chlorine and/or copper chloride present after the hydrogen plasma post-etch treatment. Once suitable parameters are found to effectively remove the chlorine residue from the test wafer, the same parameters may be employed during production. One should note that it is not necessary to remove any and all traces of chlorine residue from the surface of the metal lines and/or the substrate. Typically, the goal is to employ the post-etch treatment to effectively remove chlorine residue, i.e., to tailor the chamber parameters to remove enough of the chlorine residue such that the number of corrosion-induced device failures due to the presence of chlorine residue is acceptable from a manufacturing standpoint.

As mentioned earlier, residual chlorine from the plasma etch step employed to etch through the SiC and/or SiN etch stop layer may cause corrosion to the copper metal lines if left thereon. The corrosion may take the form of a layer of $CuCl_x$ (where x>0) on the surface of the copper metal lines, for example. Among the $CuCl_x$ compounds can be Cupric Chloride ($CuCl_2$) or Cuprous Chloride (CuCl) or a mixture of the two compounds, with the former (i.e., $CuCl_2$) having a tendency to be more soluble in an aqueous $H_2O$ solution than the latter (i.e., CuCl).

In accordance with one embodiment of the present invention, the aforementioned $CuCl_x$ compounds on the copper metal lines surface can be removed by subjecting the substrate, after the plasma etch step that employs the chlorine-containing etchant is performed, to a de-ionized (DI) water rinse process. In one embodiment, the DI water rinse is performed for 2 minutes with ambient temperature DI water. The amount of time and temperature may of course vary, with a higher temperature and a longer rinse period having a tendency to remove more of the $CuCl_x$ compounds at the expense of substrate throughput.

In another embodiment, the substrate is first dipped in a hydrochloride (HCl) solution prior to the DI water rinse. The HCl solution has a tendency to more aggressively dissolve the aforementioned $CuCl_x$ compounds from the surface of the copper metal lines. This is advantageous in situations where the thickness of the layer of $CuCl_x$ is significant. After the HCl dip followed by a DI water rinse, the chlorine residue and/or compounds may be more easily removed. Preferably, the DI water rinse is performed immediately or shortly after the HCl dip.

Preferably, the concentration of the HCl and/or the dipping time is limited to prevent undue damage to the copper material of the copper metal lines. Such damage may unduly thin the copper metal lines and disadvantageously increase its electrical resistivity. It has been found that a dip in a HCl solution of about 2% of HCl by volume (in DI water) for about 30 seconds to 2 minutes has worked well.

In one embodiment, the concentration of HCl by volume may range from about 0.01% to about 40%, more preferably from about 0.01% to about 10%, and preferably at about 2%. The dip time may range from about 1 seconds to about 300 seconds, more preferably from about 10 seconds to about 180 seconds, and preferably for about 40 seconds. The dip time requirement may decrease for a more concentrated HCl solution, and vice versa.

After the HCl dip treatment, a DI water rinse step is undertaken to remove the chlorine residue from HCl solution and/or compounds, as well as to further dissolve any remaining $CuCl_x$ compounds in the manner discussed earlier. Again, the DI water rinse step may use any suitable DI water temperature. As mentioned, a higher temperature may help increase the rate at which the $CuCl_x$ compounds dissolve. The HCl dip and/or the DI water step may take as long as necessary to effectively remove the chlorine residue, with a rinse in the range of 2–5 minutes appearing to be effective.

After the DI water post-etch treatment or the HCl/DI water post-etch treatment, the substrate may be subjected to a drying step. In one embodiment, drying is achieved by blowing dry $N_2$ or a suitably inert gas across the substrate surface. Additionally, the substrate may be spun to remove aqueous materials from the substrate surface by centrifugal force. The $N_2$ or the inert gas may be at ambient temperature or may be heated, if desired. In one case, a drying time of about five minutes with ambient temperature $N_2$ appears to work well.

Figure 6:
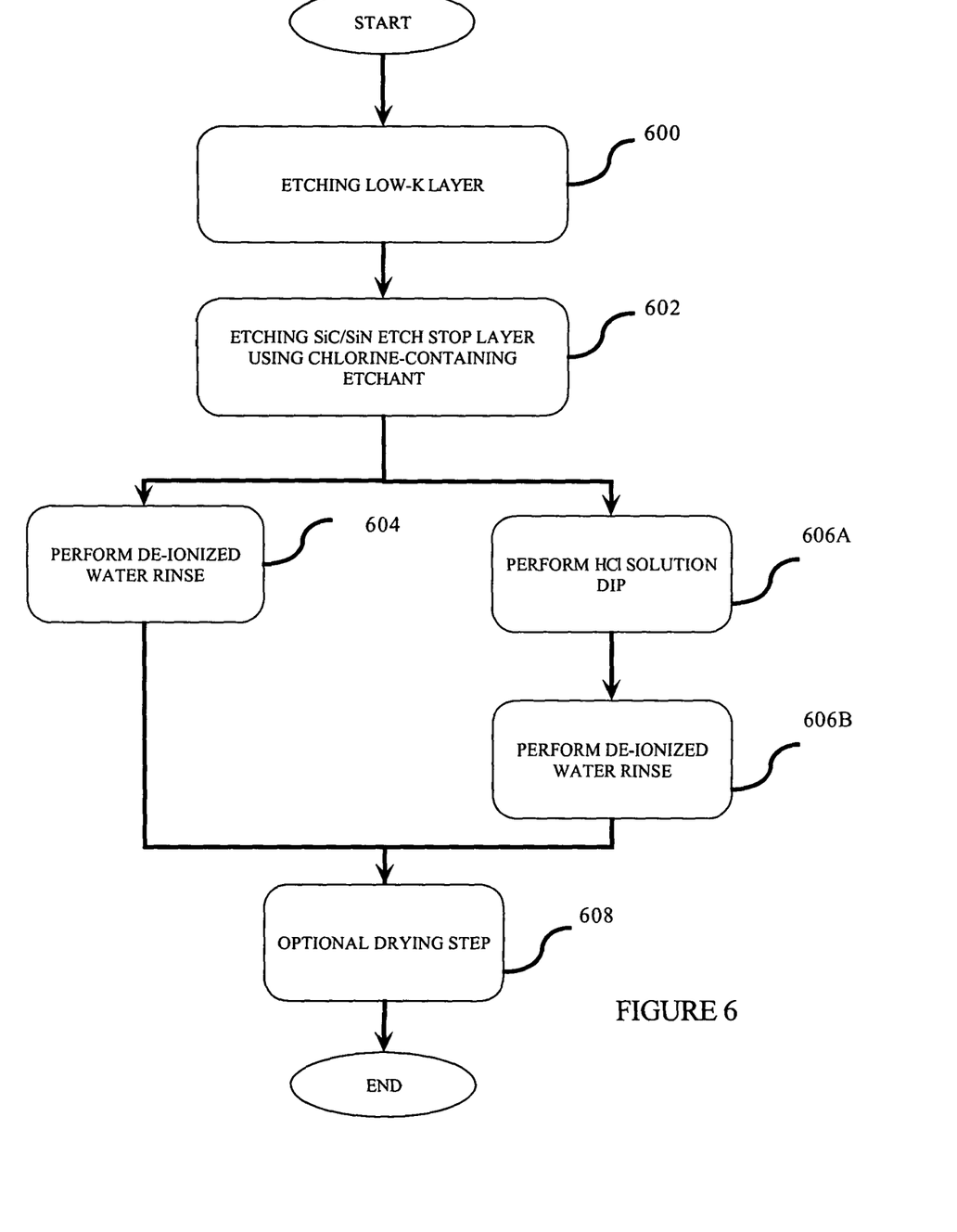
FIG. 6 shows, in accordance with one embodiment of the present invention, the steps of performing the wet post-etch treatment to reduce corrosion damage to the underlying metal layer.

FIG. 6 shows, in accordance with embodiments of the present invention, the wet post-etch treatment process, which is performed after the plasma etch process that employs the chlorine-containing etchant to etch through the etch stop layer is performed. In step 600, the low-K layer is etched. In step 602, the etch stop layer is etched in a plasma processing chamber using a chlorine-based chemistry. It should be noted that preceding processing steps for forming the dual-damascene structure are omitted from FIG. 6 for clarity's sake.

Since the use of the chlorine-based plasma may result in chlorine residue on the copper metal line surface, a DI water rinse process is undertaken in step 604. Alternatively, a HCl solution dip/DI water rinse process is undertaken in steps 606A and 606B. Afterwards, an optional drying step is undertaken in step 608.

As can be appreciated from the foregoing, the aforementioned DI water post-etch treatment or the HCl/DI water post-etch treatment advantageously removes the chlorine and/or $CuCl_x$ compounds present on the copper metal lines after the chlorine-containing etchant is employed to etch through the etch stop layer. These post-etch treatments ensure that there is less chlorine (or substantially no chlorine) present on the copper metal lines to corrode the copper metal lines over time. The aforementioned DI water post-etch treatment or the HCl/DI water post-etch treatment, being wet solution processes, advantageously require relatively inexpensive equipment to perform. Furthermore, these wet processes also facilitate batch processing. Thus, a large number of substrates may be treated at once, thereby improving substrate throughput.

As mentioned earlier, residual chlorine and/or $CuCl_x$ compounds from the aforementioned barrier removal plasma etch step may be removed from the copper metal lines by a DI water rinse process or a HCl solution dip/DI water rinse process. Either post-etch treatment process effectively minimizes the potential for corrosion-related damage to the copper metal line.

It has been found, however, that the use of a DI water rinse process may oxidize the copper metal lines. This oxidation results in the formation of copper oxides on the surface of the copper metal lines, thereby undesirably increasing the electrical contact resistance of the copper metal lines. These copper oxides may include, for example, cupric oxide (CuO) and cuprous oxide ($Cu_2O$). The copper oxides may also be formed if the substrate is left exposed to the ambient environment for any significant period of time.

In accordance with one embodiment of the present invention, the aforementioned copper oxides may be removed by a copper oxide-removal step. Thus, after the wet post-etch treatment that involves a DI water rinse and a optional dry step (drying step is typically employed for following H2 plasma treatment, but it may not be necessary for acetic acid or acetic acid/ammonium hydroxide treatment), the substrate is subjected to either a $H_2$ plasma treatment, an acetic acid ($CH_3COOH$) solution dip, or an acetic acid/ammonium hydroxide ($CH_3COOH/NH_4OH$) solution dip. In any of these copper oxide removal steps, the goal is to remove the copper oxide from the copper metal lines.

In one embodiment, the substrate is subject to the $H_2$ plasma treatment after the wet treatment (which in turn is performed after the chlorine-based plasma etch that is employed to etch through the SiC/SiN etch stop layer is performed). While not wishing to be bound by theory, it is believed that the hydrogen species react with copper oxides to form pure Cu and gas phase of water ($H_2O$), which can be evacuated from the plasma processing chamber.

In one embodiment, the $H_2$ plasma treatment to remove the copper oxides is performed using parameters roughly similar to those employed for the $H_2$ plasma process to remove the chlorine residue. The $H_2$ plasma process to remove the chlorine residue has been discussed earlier.

In one embodiment, the substrate is subject to an acetic acid ($CH_3COOH$) solution dip after the wet treatment (which in turn is performed after the chlorine-based plasma etch that is employed to etch through the SiC/SiN etch stop layer is performed). While not wishing to be bound by theory, it is believed that the acetic acid solution can dissolve copper oxides (including the aforementioned cupric oxide and cuprous oxide) and copper hydroxides, such as $Cu(OH)_2$. Although acetic acid is an organic acid and therefore relatively selective with respect to attacking the copper material, it is preferable to minimize any attack by limiting the concentration and/or treatment time when an acetic acid solution is employed.

In one example, the substrate is treated using a 5% acetic acid (by volume in DI water) for 1 minute at ambient temperature. However, the concentration of the acetic acid may vary, with a more concentrated solution requiring less treatment time, and conversely, a less concentrated solution requiring a longer treatment time. The solution temperature may also vary, with a higher solution temperature tending to require less treatment time due to the increased chemical reactivity at a higher temperature.

Generally speaking, the concentration of acetic acid by volume may range from about 2% to about 99.7%, more preferably from about 1% to about 10, and preferably at about 5%. The dip time may range from about 1 seconds to about 600 seconds, more preferably from about 30 seconds to about 300 seconds, and preferably for about 60 seconds.

In one embodiment, the substrate is subject to an acetic acid ($CH_3COOH$) and/or ammonium hydroxide ($NH_4OH$) solution dip after the wet treatment (which in turn is performed after the chlorine-based plasma etch that is employed to etch through the SiC/SiN etch stop layer is performed). While not wishing to be bound by theory, it is believed that the addition of the ammonium hydroxide to the acetic acid solution helps in removing/unmasking polymer residues. As before, although the acetic acid is an organic acid (which is relatively selective with respect to attacking the copper material) and the ammonium hydroxide is a basic solution, it is preferable to minimize such attack by limiting the concentration and/or treatment time when an acetic acid/ammonium hydroxide solution is employed.

In one example, the substrate is treated using about 1% acetic acid and about 3% ammonium hydroxide (by volume in DI water) for about 20 seconds at a temperature of about 60 degrees Celsius. However, the concentration of the acetic acid and/or ammonium hydroxide may vary, with a higher concentration of acetic acid requiring less treatment time, and conversely, a lower concentration of acetic acid requiring a longer treatment time. A higher concentration of ammonium hydroxide tends to cause pitting of the metal surface while a lower concentration of ammonium hydroxide tends to leave a residual film. The solution temperature may also vary, with a higher solution temperature requiring less treatment time due to the increased chemical reactivity at a higher temperature.

Generally speaking, the concentration of acetic acid by volume may range from about 0.5% to about 5%, more preferably from about 1% to about 3%, and preferably at about 1%. The concentration of ammonium hydroxide by volume may range from about 0.5% to about 5%, more preferably from about 1% to about 3%, and preferably at about 3%. The dip time may range from about 5 seconds to about 3 minutes, more preferably from about 10 seconds to about 2 minutes, and preferably for about 20 seconds.

Figure 7:
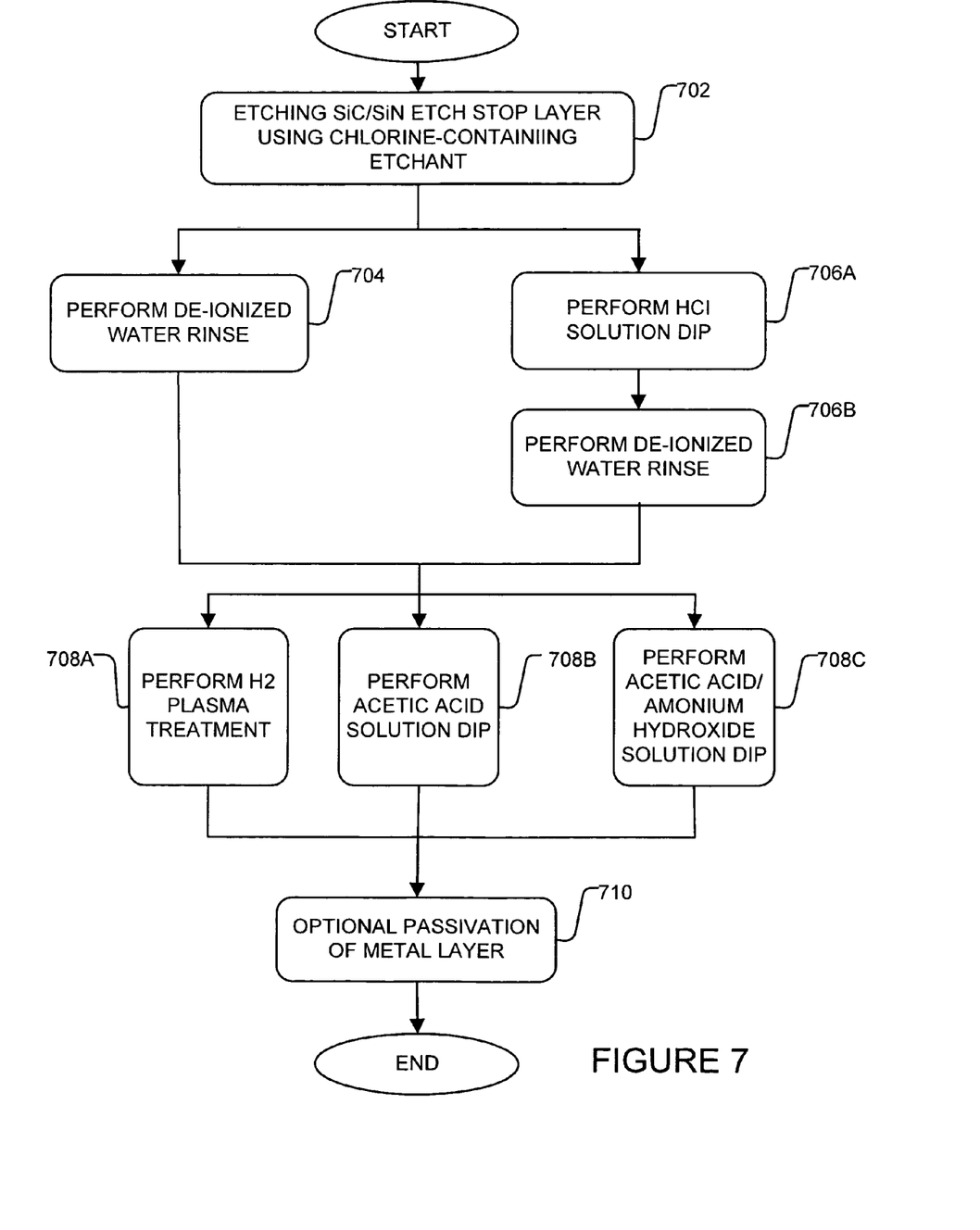
FIG. 7 shows, in accordance with one embodiment of the present invention, the steps of performing the wet post-etch treatment to remove copper oxides from the copper metal surface.

FIG. 7 shows, in accordance with embodiments of the present invention, the copper oxide removal process, which takes place after the wet post-etch treatment process is undertaken. In step 702, the SiC-containing and/or SiN-containing layer is etched in a plasma processing chamber using a chlorine-based chemistry. Again, it should be noted that preceding processing steps for forming the dual-damascene structure, such as etching through a low-K layer, are omitted from FIG. 7 for clarity's sake.

Since the use of the chlorine-based plasma may result in chlorine residue on the copper metal line surface, either a DI water rinse process is undertaken in step 704 or a HCl solution dip/DI water rinse process is undertaken in steps 706A and 706B.

Since the exposure of the substrate to the DI water may result in the formation of copper oxides and copper hydroxides, which affect the electrical contact resistance of the copper metal lines, the substrate is further treated in step 608 to remove the copper oxides and/or copper hydroxides.

Thus, in step 708a, the substrate is subject to the $H_2$ plasma treatment in the manner discussed earlier. The $H_2$ plasma treatment is advantageous since the $H_2$ plasma treatment is highly selective and tends to attack only the copper oxides and copper hydroxides, with minimal impact to the other features on the substrate surface.

Alternatively, in step 708B, the substrate is subject to an acetic acid solution dip. The acetic acid solution dip, being a wet treatment, requires substantially less expensive equipment to perform. Further, the acetic acid solution dip advantageously facilitates batch processing, thereby enhancing substrate throughput.

Alternatively, in step 708C, the substrate is subject to an acetic acid/ammonium hydroxide solution dip. As in the case with the acetic acid solution dip, the acetic acid/ammonium hydroxide solution dip, being a wet treatment, also requires substantially less expensive equipment to perform and facilitates batch treatment for improved substrate throughput.

In one embodiment, the copper metal layer is optionally passivated after the SiC or SiN etch stop layer is etched through. As mentioned before, the SiC or SiN etch stop layer is etched through using a plasma etch process in combination with a chlorine-containing etchant.

As mentioned, in one embodiment, a wet chemical treatment is performed (e.g., HCl dip, DHF, ST250, and the like) on the substrate after the SiC or SiN etch stop layer is etched through to remove the chlorine residue from the copper metal surface. After the wet chemical is performed, a de-ionized water rinse may be performed to remove the wet treatment solution. Thereafter, an organic acid treatment, such as acetic acid dip or acetic acid/ammonium hydroxide dip may be performed to remove copper oxides. The substrate is then optionally passivated using a solution of antioxidant, such as benzotriazole (BTA), also known commercially as ENTEK, in de-ionized water.

In another embodiment, the copper metal may be passivated with benzotriazole (BTA) immediately after the DI water rinse without first performing the organic acid treatment. This would be the case if, for example, it is unnecessary to remove the copper oxides from the copper metal surface using the organic acid treatment.

In another embodiment, the exposed copper metal may be passivated with benzotriazole (BTA) right after any treatment and/or processing step if the preceding treatment and/or processing step has resulted in a copper metal layer that is substantially corrosion-free and/or free from potential for future corrosion.

In one embodiment, a solution of about 0.001% to about 5% by weight of benzotriazole in de-ionized water appears to work well in passivating the copper metal surface. The passivation dip may be performed for about 5 seconds to about 300 seconds. In another embodiment, a solution of about 0.02% by weight of benzotriazole is employed for passivating the copper metal surface.

After passivation, the substrate surface may be dried using, for example, $N_2$ gas.

The optional passivation prevents the copper material from reacting with oxygen in the ambient environment or in the water of future processing steps, thereby effectively controlling the corrosion of the copper material. As one advantage, it is possible to extend the time between the drying step and the next processing step, such as further copper deposition. In contrast, the prior art requires that the substrate be processed as soon as possible after the drying step to prevent undue corrosion of the copper material.

Although the description above contains many specifications, these should not be construed as limiting the scope of the invention but as merely providing illustrations of some of the presently preferred embodiments of this invention. For example, although a low-K layer is discussed in some examples as the layer that overlies the etch stop layer, it should be understood that the invention also applies to a layer stack wherein the overlying layer is simply a dielectric layer. Thus, the scope of the invention should be determined by the appended claims and their legal equivalents rather than by the illustrative examples given.

What is claimed is:

1. A method for processing substrate to form a semiconductor device, said substrate including an etch stop layer disposed above a metal layer, comprising:

etching through said etch stop layer, using a plasma etch process that utilizes a chlorine-containing etchant source gas, thereby forming etch stop layer openings in said etch stop layer, said etch stop layer including at least one of a SiN and SiC material;

performing a de-ionized water rinse on said substrate; and thereafter performing a wet treatment on said substrate, said wet treatment including a rinse using a solution that contains acetic acid ($CH_3COOH$).

2. The method of claim 1 wherein said metal layer represents a copper-containing metallization layer.

3. The method of claim 2 wherein said substrate further includes a dielectric layer disposed above said etch stop layer.

4. The method of claim 3 wherein a material of said dielectric layer has a dielectric constant of less than 4.

5. The method of claim 4 wherein said etching through said etch stop layer is performed through dielectric layer openings in said dielectric layer.

6. The method of claim 3 wherein said etching through said etch stop layer is performed through dielectric layer openings in said dielectric layer.

7. The method of claim 1 wherein said etch stop layer includes said SiC material.

8. The method of claim 1 wherein said solution further includes ammonium hydroxide ($NH_4OH$).

9. The method of claim 8 wherein said ammonium hydroxide concentration is between about 0.5% and about 10% by volume.

10. The method of claim 9 wherein said acetic acid concentration is between about 1% and about 99.5% by volume.

11. The method of claim 1 wherein said acetic acid concentration is between about 1% and about 99.5% by volume.

12. A method for performing a dual damascene process on a substrate, said substrate including a dielectric layer disposed above an etch stop layer, said etch stop layer being disposed above a metal layer, comprising:
performing plasma etching through said dielectric layer using a first etchant source gas to form a plurality of dielectric-layer openings;
performing plasma etching through said etch stop layer, using a second etchant source gas different from said first etchant source gas, said second etchant source gas including chlorine, thereby forming etch stop layer openings in said etch stop layer, said etch stop layer including at least one of a SiN and SiC material;
performing one of a de-ionized water rinse and a HCl dip/de-ionized water rinse on said substrate; and
thereafter performing a wet treatment on said substrate, said wet treatment including a rinse using a solution that contains acetic acid ($CH_3COOH$).

13. The method of claim 12 wherein said metal layer represents a copper-containing metallization layer.

14. The method of claim 13 wherein a material of said dielectric layer has a dielectric constant of less than 4.

15. The method of claim 14 wherein said etch stop layer includes said SiC material.

16. The method of claim 12 wherein said solution further includes ammonium hydroxide ($NH_4OH$).

17. The method of claim 16 wherein said ammonium hydroxide concentration is between about 0.5% and about 10% by volume.

18. The method of claim 17 wherein said acetic acid concentration is between about 0.5% and about 99.5% by volume.

19. The method of claim 12 wherein said acetic acid concentration is between about 1% and about 99.7% by volume.

20. The method of claim 12 wherein a material of said dielectric layer has a dielectric constant of less than 4.

21. The method of claim 12 wherein said plasma etching through said etch stop layer is performed in a capacitively-coupled plasma processing system.

22. The method of claim 12 wherein said plasma etching through said etch stop layer is performed in an inductively-coupled plasma processing system.

23. A method for processing substrate to form a semiconductor device, said substrate including an etch stop layer disposed above a metal layer, comprising:
etching through said etch stop layer, using a plasma etch process that utilizes a chlorine-containing etchant source gas, wherein said chlorine-containing etchant source gas includes an inert gas, said inert gas including at least one of Ar, He, Ne, Kr, and Xe, thereby forming etch stop layer openings in said etch stop layer, said etch stop layer including at least one of a SiN and SiC material;
performing a HCL solution dip on said substrate;
thereafter performing a rinse on said substrate, said rinse using a rinsing solution that includes de-ionized water; and
thereafter performing a $H_2$ plasma treatment on said substrate.

24. The method of claim 23 wherein said metal layer represents a copper-containing metallization layer.

25. The method of claim 24 wherein said substrate further includes a dielectric layer disposed above said etch stop layer.

26. The method of claim 25 wherein said etching through said etch stop layer is performed through dielectric openings in said dielectric layer.

27. The method of claim 25 wherein a material of said dielectric layer has a dielectric constant less than 4.

28. The method of claim 23 wherein said etch stop layer includes said SiC material.

29. The method of claim 23 wherein said plasma etching through said etch stop layer is performed in a capacitively-coupled plasma processing system.

30. The method of claim 23 wherein said plasma etching through said etch stop layer is performed in an inductively-coupled plasma processing system.

31. A method for processing substrate to form a semiconductor device, said substrate including an etch stop layer disposed above a copper metal layer, comprising:
etching through said etch stop layer, using a plasma etch process that utilizes a chlorine-containing etchant source gas, thereby forming etch stop layer openings in said etch stop layer, said etch stop layer including at least one of a SiN and SiC material;
performing a wet chemical treatment on said substrate, said wet chemical treatment employing a solution that includes an organic acid or a mixture of an organic acid and a hydroxide; and
thereafter passivating said copper metal layer through said etch stop layer openings with a passivating solution that includes benzotriazole(BTA).

32. The method of claim 31 wherein said substrate further includes a dielectric layer disposed above said etch stop layer.

33. The method of claim 32 wherein a material of said dielectric layer has a dielectric constant less than 4.

34. The method of claim 32 wherein said etching through said etch stop layer is performed through dielectric layer openings in said dielectric layer.

35. The method of claim 34 wherein said etch stop layer includes said SiC material.

36. The method of claim 31 wherein said organic acid is an acetic acid.

37. The method of claim 31 wherein said hydroxide is ammonium hydroxide.

38. The method of claim 31 further including performing one of a de-ionized water rinse and a HCl dip/de-ionized water rinse on said substrate prior to said wet chemical treatment.

39. The method of claim 31 further including performing a $H_2$ plasma treatment on said substrate prior to said passivating.

40. A method for processing substrate to form a semiconductor device, said substrate including an etch stop layer disposed above a metal layer, comprising:
etching through said etch stop layer, using a plasma etch process that utilizes a chlorine-containing etchant source gas, thereby forming etch stop layer openings in said etch stop layer, said etch stop layer including at least one of a SiN and SiC material;
performing a HCL dip/de-ionized water rinse on said substrate; and thereafter performing a wet treatment on said substrate, said wet treatment including a rinse using a solution that contains acetic acid ($CH_3COOH$).

41. The method of claim 40 wherein said metal layer represents a copper-containing metallization layer.

42. The method of claim 41 wherein said substrate further includes a dielectric layer disposed above said etch stop layer.

43. The method of claim 42 wherein a material of said dielectric layer has a dielectric constant of less than 4.

44. The method of claim 43 wherein said etching through said etch stop layer is performed through dielectric layer openings in said dielectric layer.

45. The method of claim 42 wherein said etching through said etch stop layer is performed through dielectric layer openings in said dielectric layer.

46. The method of claim 40 wherein said etch stop layer includes said SiC material.

47. The method of claim 40 wherein said solution further includes ammonium hydroxide ($NH_4OH$).

48. The method of claim 47 wherein said ammonium hydroxide concentration is between about 0.5% and about 10% by volume.

49. The method of claim 48 wherein said acetic acid concentration is between about 1% and about 99.5% by volume.

50. The method of claim 40 wherein said acetic acid concentration is between about 1% and about 99.7% by volume.

* * * * *